United States Patent
Chiu et al.

(10) Patent No.: US 8,258,752 B2
(45) Date of Patent: Sep. 4, 2012

(54) INTEGRATED PMOS TRANSISTOR AND SCHOTTKY DIODE AND CHARGING SWITCH CIRCUIT EMPLOYING THE INTEGRATED DEVICE

(75) Inventors: Kuo-Chin Chiu, Hsinchu (TW); Chih-Feng Huang, Chupei (TW)

(73) Assignees: Richpower Microelectronics Corporation, Grand Cayman, British Indian Ocean Territories (KY); Richtek Technology Corporation, R.O.C., Hsin-Chu (TW)

( * ) Notice: Subject to any disclaimer, the term of this patent is extended or adjusted under 35 U.S.C. 154(b) by 504 days.

(21) Appl. No.: 12/629,956

(22) Filed: Dec. 3, 2009

(65) Prior Publication Data

US 2010/0295515 A1    Nov. 25, 2010

Related U.S. Application Data

(63) Continuation-in-part of application No. 12/470,534, filed on May 22, 2009, now Pat. No. 7,943,994.

(51) Int. Cl.
*H02J 7/00* (2006.01)
*H02J 7/04* (2006.01)
*H02J 7/16* (2006.01)

(52) U.S. Cl. ........ 320/132; 320/134; 320/136; 320/152; 279/341; 279/449; 279/471; 279/133; 279/390

(58) Field of Classification Search ................... 320/132
See application file for complete search history.

(56) References Cited

U.S. PATENT DOCUMENTS 4,801,983 A * 1/1989 Ueno et al. ............. 257/390
6,049,108 A * 4/2000 Williams et al. ......... 257/341

* cited by examiner

*Primary Examiner* — Edward Tso
*Assistant Examiner* — Ahmed Omar
(74) *Attorney, Agent, or Firm* — Tung & Associates

(57) ABSTRACT

The present invention discloses an integrated PMOS transistor and Schottky diode, comprising a PMOS transistor which includes a gate, a source, a drain and a channel region between the source and drain, wherein the source, drain and channel region are formed in a substrate, and a parasitic diode is formed between the drain and the channel region; and a Schottky diode formed in the substrate and connected in reverse series with the parasitic diode, the Schottky diode having one end connected with the parasitic diode and the other end connected with the source.

13 Claims, 6 Drawing Sheets

INTEGRATED PMOS TRANSISTOR AND SCHOTTKY DIODE AND CHARGING SWITCH CIRCUIT EMPLOYING THE INTEGRATED DEVICE

CROSS REFERENCE TO RELATED APPLICATIONS

This application is a continuation-in-part application of U.S. patent application Ser. No. 12/470,534, filed on May 22, 2009 now U.S. Pat. No 7,943,994.

FIELD OF INVENTION

The present invention relates to an integrated device of a PMOS transistor and a Schottky diode, and a charging switch circuit employing the integrated device.

DESCRIPTION OF RELATED ART

A power management circuit often requires a power switch device formed by a stand-alone PMOS transistor and a stand-alone Schottky diode. Referring to FIG. 1, a PMOS transistor 14 and a Schottky diode 12 are connected in series to form the power switch device, wherein the PMOS transistor 14 includes a parasitic diode 14D formed between the drain and the channel region of the transistor 14. A control circuit 10 controls the gate of the PMOS transistor 14 to convert an input voltage Vin to an output voltage Vo. The Schottky diode 12 is provided for blocking current flowing reversely via the parasitic diode 14D when the output voltage Vo is higher than the input voltage Vin, so that the reverse current does not occur to damage the input voltage Vin.

The drawbacks of the above mentioned prior art are that the stand-alone PMOS transistor and the stand-alone Schottky diode occupy a large amount of circuit area, and that their connection in series increases the On-time resistance Ron between the input voltage Vin and the output voltage Vo. Under large current condition, a voltage drop caused by the on-time resistance Ron can be as high as 0.8V or even higher, resulting in considerable power consumption.

In view of the foregoing problem of the prior art, the present invention provides an integrated device of a PMOS transistor and a Schottky diode to reduce the circuit area of the power switch device and to lower the on-time resistance. In addition, the present invention also provides a charging switch circuit employing the integrated device.

SUMMARY OF THE INVENTION

An objective of the present invention is to provide an integrated device of a PMOS transistor and a Schottky diode. This integrated device can be a planar type or a trench type device.

Another objective of the present invention is to provide a charging switch circuit formed by the foregoing integrated device to reduce unnecessary power consumption when charging a battery.

In order to achieve the foregoing objective, in one perspective, the present invention provides an integrated device of a PMOS transistor and a Schottky diode, comprising: a PMOS transistor which includes a gate, a source, a drain and a channel region between the source and drain, wherein the source, drain and channel region are formed in a substrate, and a parasitic diode is formed between the drain and the channel region; and a Schottky diode formed in the substrate and connected in reverse series with the parasitic diode, the Schottky diode having one end connected with the parasitic diode and the other end connected with the source.

Preferably, the Schottky diode includes a portion of a well region having the same conductive type as the channel region and not having an ohmic contact.

Preferably, the Schottky diode further includes a doped region having a different conductive type from the channel region.

In another perspective, the present invention provides an integrated device of a PMOS transistor and a Schottky diode, comprising: a substrate; a conductive layer forming a gate of the PMOS transistor on the substrate; a first N-type well region, a portion of which forms a channel region of the PMOS transistor in the substrate; a first P-type doped region forming a drain of the PMOS transistor in the first well region, wherein a parasitic diode is formed between the drain and the well region; a second P-type doped region forming a source of the PMOS transistor in the first well region; and a Schottky diode formed by another portion of the first well region and connected in reverse series with the parasitic diode, said another portion of the first well region not having an N-type ohmic contact.

Preferably, said another portion of the first well region further includes a third P-type doped region.

In yet another perspective, the present invention provides an integrated device of a PMOS transistor and a Schottky diode, comprising: a P-type substrate forming a drain of the PMOS transistor; two conductors filled in the substrate to form a gate of the PMOS transistor; an N-type well region between the two conductors, the N-type well region having a portion which forms a channel region of the PMOS transistor, wherein a parasitic diode is formed between the drain and the channel region; a P-type doped region forming a source of the PMOS transistor above the N type well region; and a Schottky diode formed by another portion of the first well region and connected in reverse series with the parasitic diode, said another portion of the first well region not having an N-type ohmic contact.

Preferably, at least two P-type doped regions are provided above the N type well region.

Preferably, the substrate includes a body with a higher doping concentration and an epitaxially grown region with a lower doping concentration above the body.

In yet another perspective, the present invention provides a charging switch circuit for coupling a power source and a battery to be charged, the charging switch circuit comprising: a first and a second integrated devices, and a transistor controlling the first integrated device, wherein each integrated device includes: a PMOS transistor which includes a gate, a source, a drain and a channel region between the source and the drain, wherein the source, drain and channel region are formed in a substrate, and a parasitic diode is formed between the drain and the channel region; and a Schottky diode formed in the substrate and connected in reverse series with the parasitic diode, the Schottky diode having one end connected with the parasitic diode and the other end connected with the source; wherein the first integrated device is coupled between the power source and the battery, the source of the first integrated device being coupled to the power source and the drain of the first integrated device being coupled to the battery; the second integrated device is coupled between the gate and the drain of the first integrated device, the source of the second integrated device being coupled to the gate of the first integrated device, the drain of the second integrated device being coupled to the drain of the first integrated device, and the gate of the second integrated device being controlled by the power source; and the transistor controlling the first integrated device has a first end controlled by the power source, a second end receiving a control signal for controlling the first integrated device, and a third end controlling the gate of the first integrated device.

In the foregoing charging switch circuit, the transistor controlling the first integrated device can be a MOS transistor or a bipolar junction transistor (BJT). When the transistor controlling the first integrated device is a MOS transistor, it is preferably a laterally diffused metal oxide semiconductor (LDMOS) transistor; when the transistor controlling the first integrated device is a BJT, it is preferably a lateral npn (LNPN) transistor.

In yet another perspective of the present invention, it provides a charging switch circuit for coupling a power source and a battery to be charged, the charging switch circuit comprising: a first PMOS transistor including a gate, a source, a drain and a channel region between the source and the drain, wherein the source, the drain and the channel region are formed in a substrate, a first parasitic diode being formed between the source and the channel region, and a second parasitic diode being formed between the drain and the channel region, wherein the first and the second parasitic diodes are connected in reverse series; a second PMOS transistor including a gate, a source, a drain and a channel region between the source and the drain, wherein the source, the drain and the channel region are formed in a substrate, a third parasitic diode being formed between the source and the channel region, and a fourth parasitic diode being formed between the drain and the channel region, wherein the third and the fourth parasitic diodes are connected in reverse series; and a transistor controlling the gate of the first PMOS transistor; wherein the first PMOS transistor is coupled between the power source and the battery, the source of the first PMOS transistor being coupled to the power source and the drain of the first PMOS transistor being coupled to the battery; the second PMOS transistor is coupled between the gate and the drain of the first PMOS transistor, the source of the second PMOS transistor being coupled to the gate of the first PMOS transistor, the drain of the second PMOS transistor being coupled to the drain of the first PMOS transistor, and the gate of the second PMOS transistor being controlled by the power source; and the transistor controlling the first PMOS transistor has a first end controlled by the power source, a second end receiving a control signal for controlling the first PMOS transistor, and a third end controlling the gate of the first PMOS transistor.

In the foregoing charging switch circuit, the first and the third parasitic diodes can be a normal diode or a Schottky diode.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, but not drawn according to actual scale.

Figure 2:
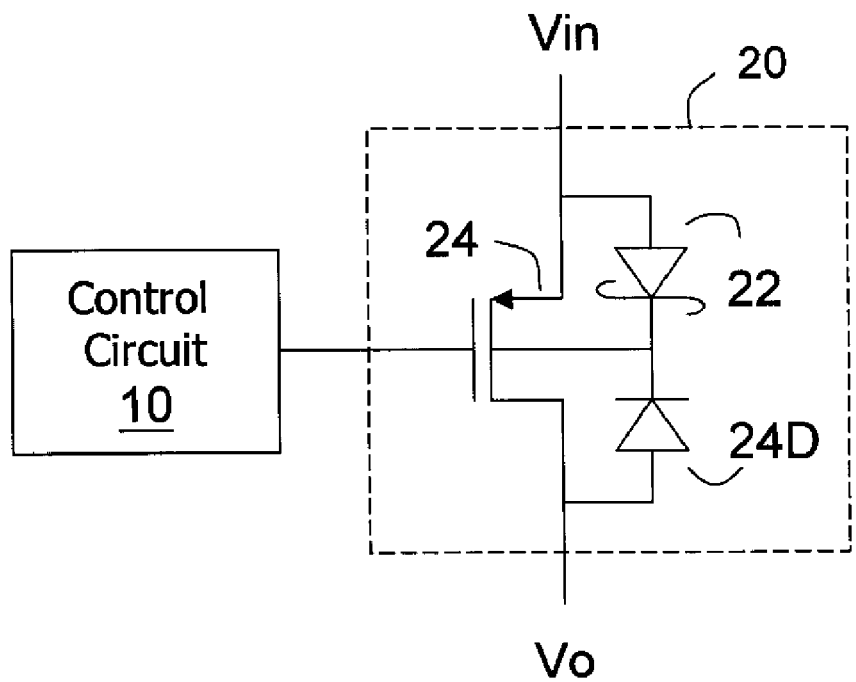
FIG. 2 is a circuit diagram shows an embodiment of the present invention.

Please refer to FIG. 2, which shows an embodiment of the present invention by way of a circuit diagram. As shown in the drawing, this embodiment provides a Schottky diode 22 which is not connected with the PMOS transistor 24 in series, but is integrated as a portion of the PMOS transistor 24 to form a power switch device 20. The Schottky diode 22 is formed on the same semiconductor substrate of the PMOS transistor 24, connected in reverse series with a parasitic diode 24D of the PMOS transistor 24. The parasitic diode 24D is formed between a drain and a channel of the PMOS transistor 24. By this structure, the power transmission between the input voltage Vin and the output voltage Vo is only adversely affected by the on-time resistance of the PMOS transistor 24, without a voltage drop caused by the Schottky diode. Thus, the power consumption of the present invention can be considerably reduced.

Figure 3:
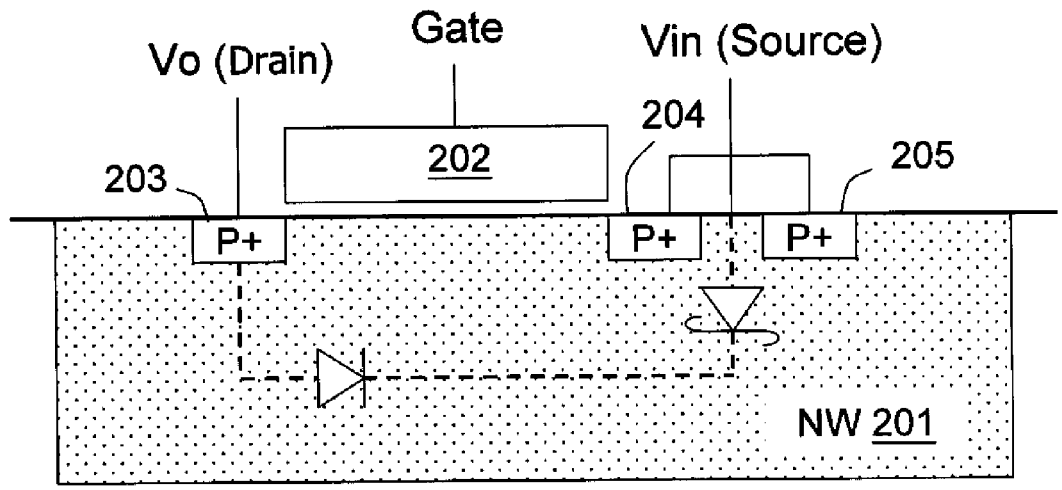
FIG. 3 illustrates an embodiment as to how the present invention may be embodied by a semiconductor structure.

FIG. 3 shows an example as to how the present invention can be embodied by semiconductor. As shown in the figure, an N type well region 201 is formed in a substrate, and a gate oxide layer (not shown) and a gate layer 202 is deposited and formed on the substrate. Next, P+ heavily doped regions 203 and 204 are formed in the substrate by ion implantation, as the drain and the source of the PMOS transistor 24 respectively. The input voltage Vin is coupled to the P+ doped region 204 of the PMOS transistor 24, and is also directly coupled to the N type well region 201. Because an ohmic contact is not provided at the location where the input voltage Vin is directly coupled to the N type region 201, a conduction barrier is higher there. This is equivalent to providing a Schottky diode connected in reverse series with a parasitic diode formed by the P+ type doped region 203 and the N type well region 201, such that current is blocked from flowing reversely back to the input voltage Vin from the output voltage Vo via the N type well region 201. Preferably, a P+ doped region 205 with a higher doping concentration can be further provided at a position near the Schottky diode in the N type well region 201 for better controlling a reverse leakage current of the Schottky diode.

As shown in FIG. 3, the circuit area occupied by the present invention is comparable to the circuit area of a single PMOS transistor 24 (plus the P+ doped region, which is very small), much smaller than the prior art. Since the unit area of the overall power switch device is reduced because the circuit area of the Schottky is saved, with the same total area of the power switch device, the PMOS transistor 24 in the present invention can employ a larger circuit area to further reduce the on-time resistance. More specifically, in comparison to prior art using the same total circuit area, the on-time resistance of the power switch device of the present invention is only approximately ¼ of the prior art, because the input-output path in the present invention does not include a Schottky diode, and the on-time resistance of the PMOS transistor 24 is only about half of the PMOS transistor in the prior art.

Figure 4:
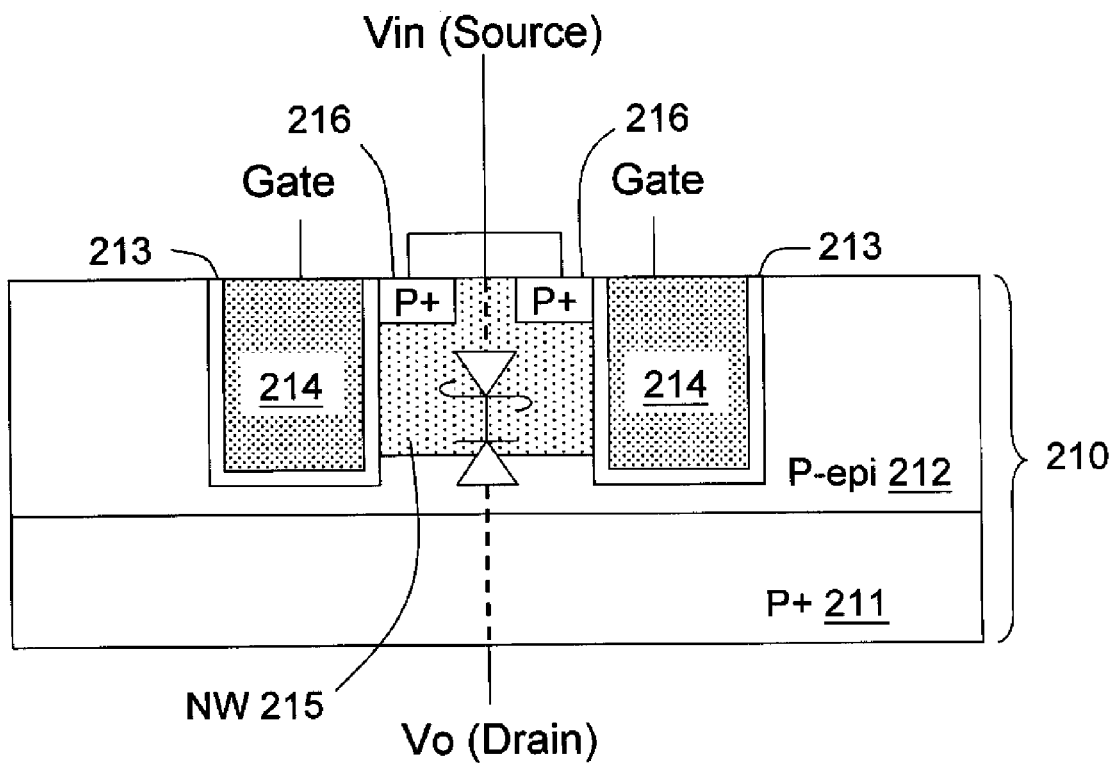
FIG. 4 illustrates another embodiment as to how the present invention may be embodied by a semiconductor structure.

FIG. 4 shows another embodiment of the present invention, wherein the PMOS transistor is a trench type transistor. As shown in the figure, two trenches are formed on a P type substrate 210; a gate oxide layer 213 is formed by thermal oxidation or by other methods; a conductor 214 (such as a doped silicon or other conductor) is filled in the trenches; thus, a gate of the trench type PMOS transistor is formed. In the substrate region between the two trenches, an N type doped well region 215 is formed by ion implantation (this step can be taken before of after the forming of the trenches), and a P+ heavily doped region 216 is formed on the surface of the N type well region 215; thus, a source of the trench type PMOS transistor is formed. The back side of the substrate is the drain of the trench transistor. In one embodiment, in order to provide a better ohmic contact for the drain, the P type substrate 210 preferably includes a P+ type body 211 with a higher doping concentration and a P type epitaxially grown region 212. Similarly to the previous embodiment, the input voltage Vin is coupled to the P+ type doped region 216 of the PMOS transistor 24, and is also directly coupled to the N type well region 215. Further, an ohmic contact is not provided at the location where the input voltage Vin is connected to the N type well region 215, such that a Schottky diode is formed there. In this embodiment, the P+ type doped region 216 acts as the source of the PMOS transistor 24 in one aspect, and also controls the reverse leakage current of the Schottky diode in another aspect.

Figure 5:
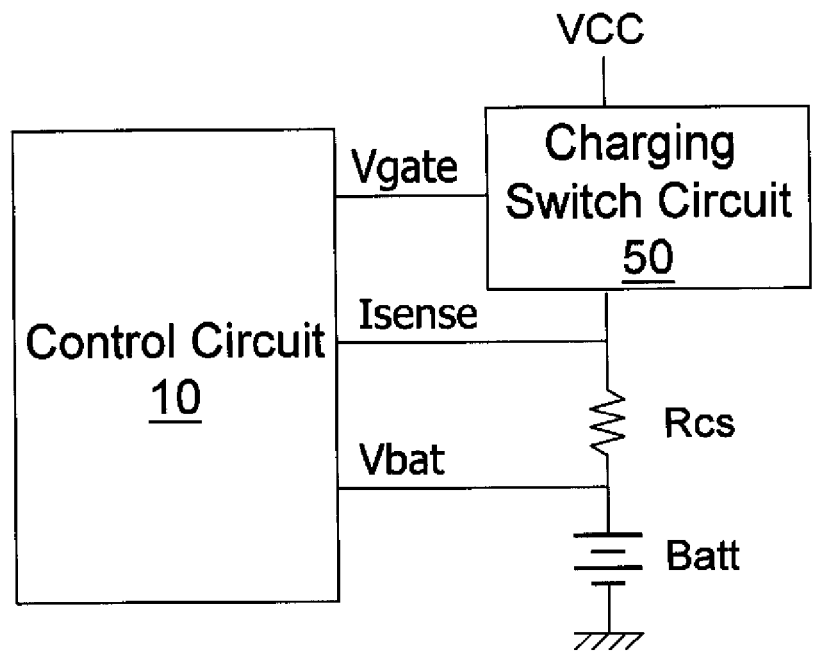
FIG. 5 shows a typical circuit structure to charge a battery.

The integrated power switch device according to the present invention can be used in many applications, such as for use as a charging switch. Referring to FIG. 5, which shows a typical circuit structure to charge a battery Batt by a power source VCC, wherein a control circuit 10 generates a signal Vgate for controlling a charging switch circuit 50 according to the battery voltage Vbat and the charging current. The charging current may be obtained according to a voltage across the resistor Rcs (charging current=(Isense−Vbat)/Rcs).

Figure 1:
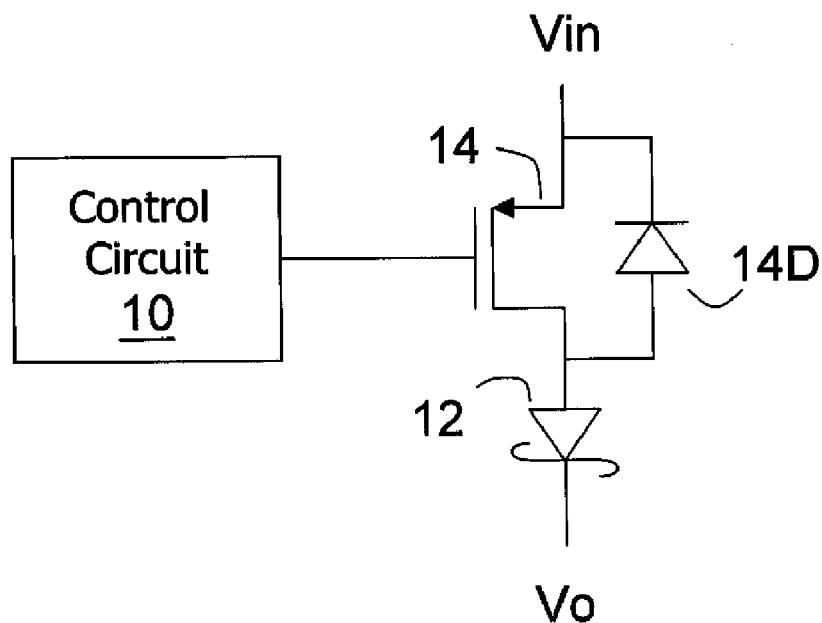
FIG. 1 shows a power switch device in the prior art, which includes a stand-alone PMOS transistor and a stand-alone Schottky diode.
Figure 6:
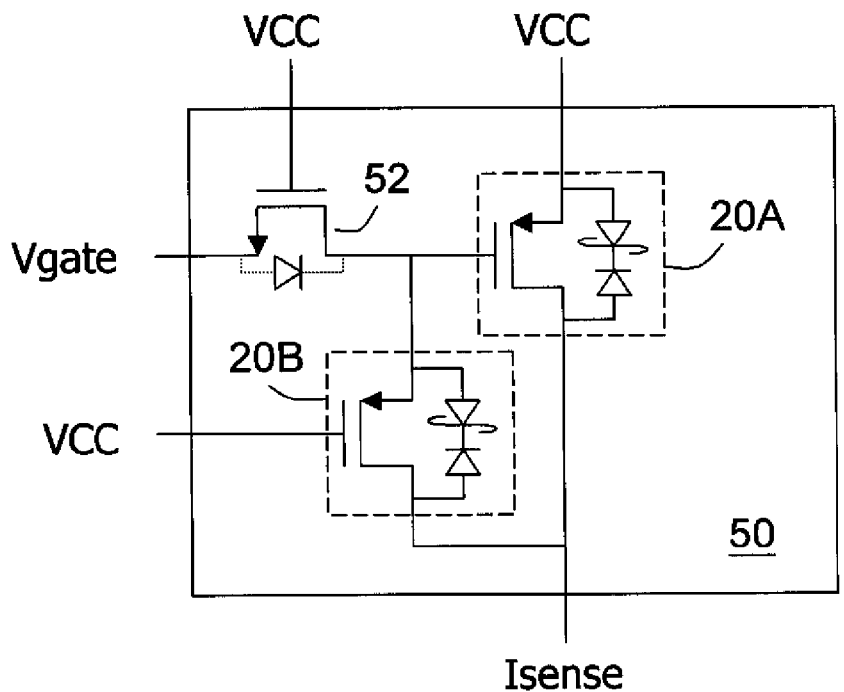
FIG. 6 shows an embodiment of a charging switch circuit formed by an integrated power switch device of the present invention.

FIG. 6 shows an embodiment of the charging switch circuit 50 formed by an integrated power switch device 20 of the present invention. The charging switch circuit 50 of this embodiment includes two integrated devices 20A and 20B, and an NMOS transistor 52. The first integrated device 20A is coupled between the power source VCC and the battery Batt, of which the source is coupled to the power source VCC and the drain is coupled to a node Isense. The NMOS transistor 52 has a gate controlled by the power source VCC, a source coupled to the output Vgate of the control circuit 10, and a drain controlling the gate of the first integrated device 20A (the connection of the source and the drain of the NMOS transistor 52 will be explained later in conjunction with FIG. 8). The second integrated device 20B is coupled between the gate and the grain of the first integrated device 20A, the gate of the second integrated device 20B being controlled by the power source VCC. As can be seen from the foregoing structure, when the battery Batt is charged, the charging current only passes through one PMOS transistor, from the power source VCC to the node Isense. Thus, the power consumption of the present invention is far less than that of the prior art shown in FIG. 1.

Figure 7:
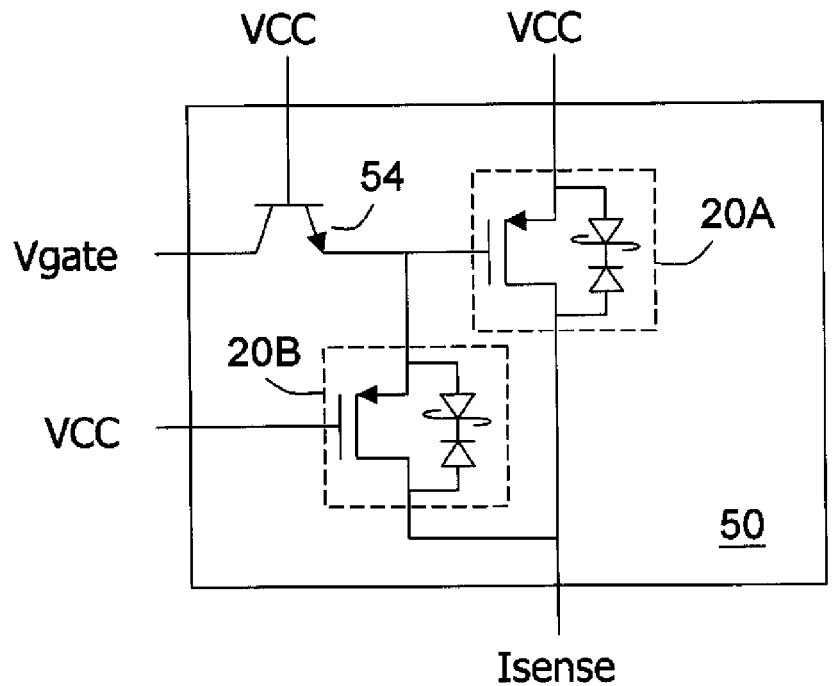
FIG. 7 shows another embodiment of a charging switch circuit formed by an integrated power switch device of the present invention.

There is more than one way to form the charging switch circuit 50. FIG. 7 shows another embodiment, wherein the NMOS transistor 52 is replaced by a bipolar junction transistor (BJT) 54. This embodiment can achieve the same function as the embodiment shown in FIG. 6.

In the foregoing embodiments, the integrated devices 20A and 20B can be formed by a planar type structure as shown in FIG. 3 or a trench type structure as shown in FIG. 4. In one embodiment, the integrated device is preferably formed by the trench type structure; the NMOS transistor 52 is preferably a laterally diffused metal oxide semiconductor (LDMOS) transistor, or the BJT 54 is preferably a lateral npn (LNPN) transistor.

Figure 8:
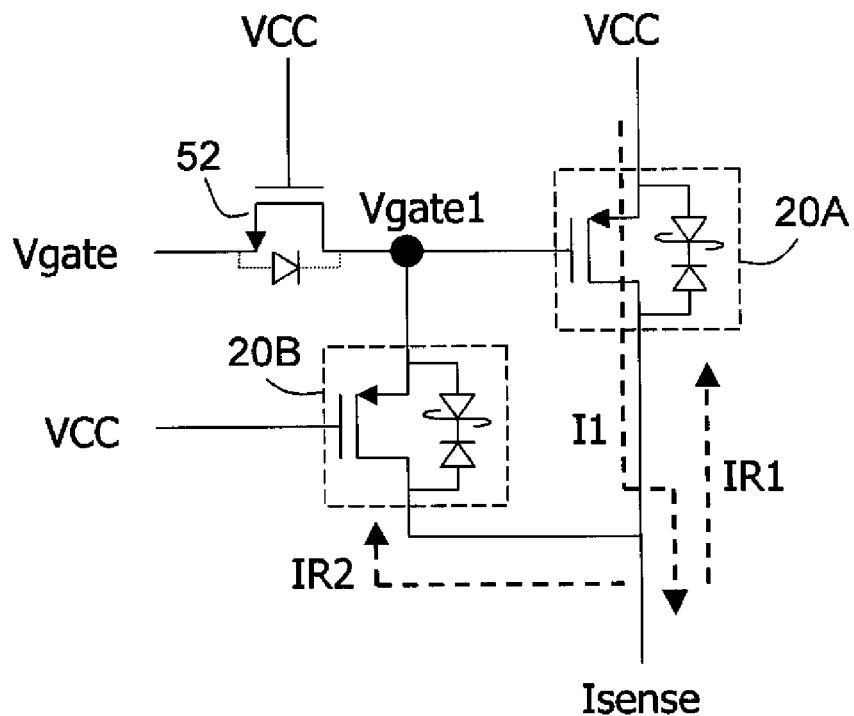
FIG. 8 illustrates that the charging switch circuit of the present invention consumes only very limited power.

Referring to FIG. 8, and taking the embodiment in FIG. 6 for example, the operation of the charging switch circuit 50 of the present invention is explained hereafter. Assuming that the power source VCC is 5V and the battery voltage Vbat is 4.2 V when fully charged:

In charging status, VCC=5V; Vgate=5V; hence, Vgate1=5V; the first integrated device 20A is turned off; and I1=0. When the control circuit 10 generates a 0V Vgate signal, VCC=5V; Vgate=0V; hence, Vgate1=0V; the first integrated device 20A is turned on; the charging current I1 charges the battery Batt via the resistor Rcs.

After charging of the battery is completed, and the charging switch circuit 50 is departed from the power source VCC, VCC=0; Vgate=0V; and Vbat=4.2V. At this time point, the NMOS transistor 52 is turned off, but the second integrated device 20B is turned on; Vgate1=4.2; and the first integrated device 20 is turned off. Thus, the reverse current IR1=IR2~0. It can thus be understood that when the NMOS transistor 52 is employed, it is preferred to connect the source of the NMOS transistor 52 to the node Vgate1, and to connect the drain of the NMOS transistor 52 to the control circuit 10, so as to prevent the reverse current IR2 from flowing toward the control circuit 10 via a parasite diode in the body of the NMOS transistor 52.

As can be seen from the foregoing illustration, the power consumption of the present invention is very low, and is far superior to the prior art.

Figure 9:
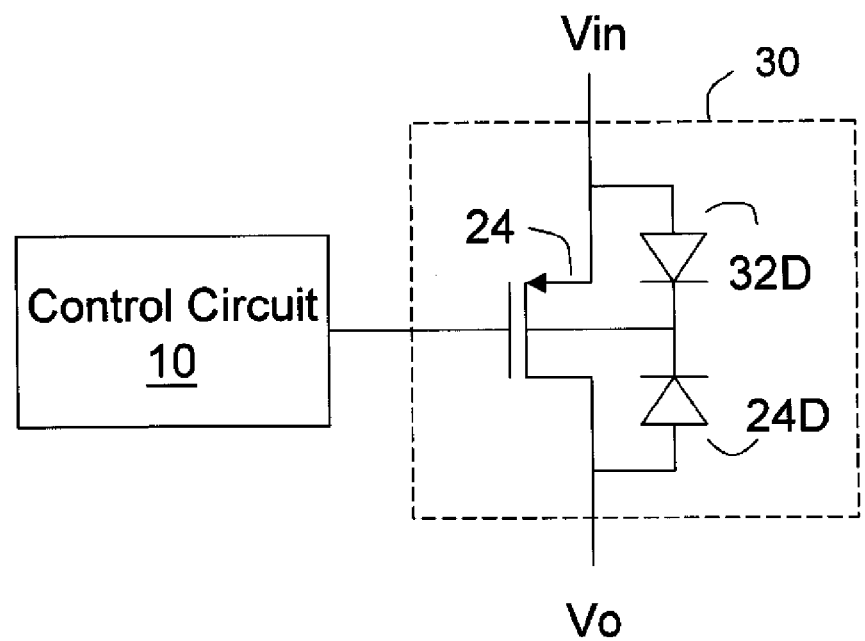
FIG. 9 shows another power switch device that can be employed in the charging switch circuit of the present invention.
Figure 10:
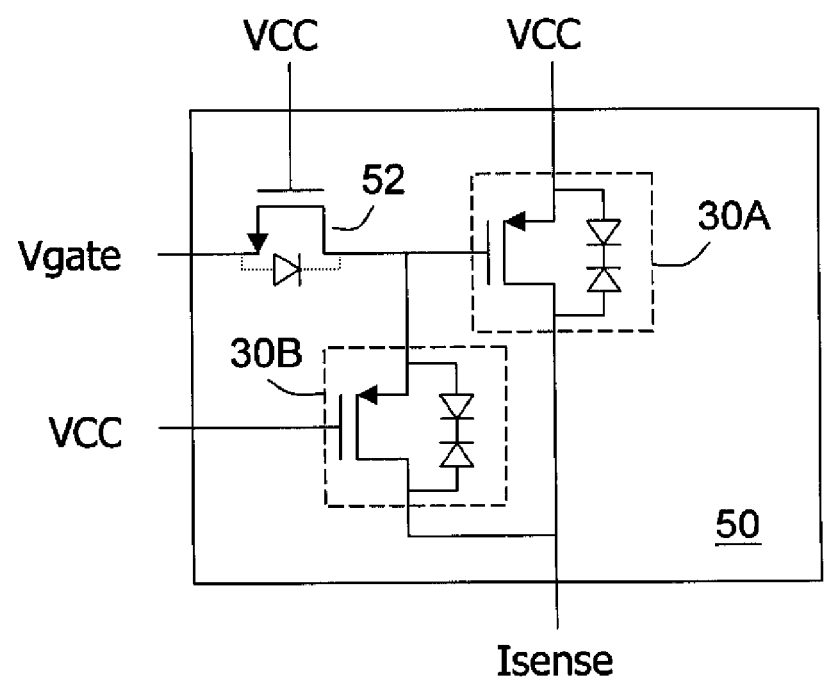
FIG. 10 shows yet another embodiment of the charging switch circuit of the present invention.

When the present invention is applied in the charging switch circuit 50, it is not necessary to integrate a Schottky diode in the PMOS transistor. Referring to FIG. 8, it is only required to prevent the reverse current IR1 from flowing through the body of the PMOS transistor in the charging switch circuit 50. Therefore, referring to FIG. 9, the Schottky diode 22 can be replaced by a diode 32D; in this case, the integrated device 20 becomes a PMOS transistor 30 with dual parasitic diodes 32D and 24D connected in reverse series. Referring to FIG. 10, the integrated devices 20A and 20B in FIG. 6 can be replaced by PMOS transistors 30A and 30B, which still form the charging switch circuit 50 and achieve a similar function. Certainly, the integrated circuits 20A and 20B in FIG. 7 can also be replaced in the same way.

Figure 11:
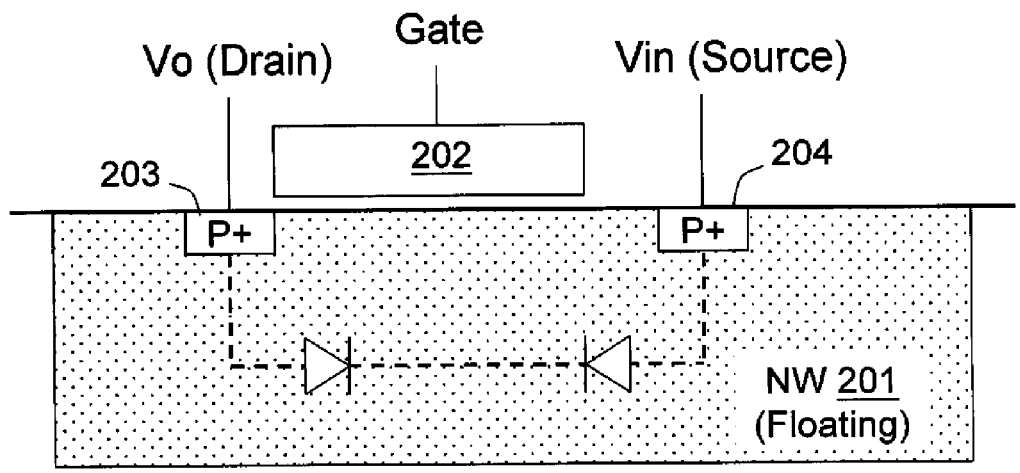
FIG. 11 shows an embodiment of the PMOS transistor in FIG. 9, to illustrate how the present invention may be embodied by a semiconductor structure.
Figure 12:
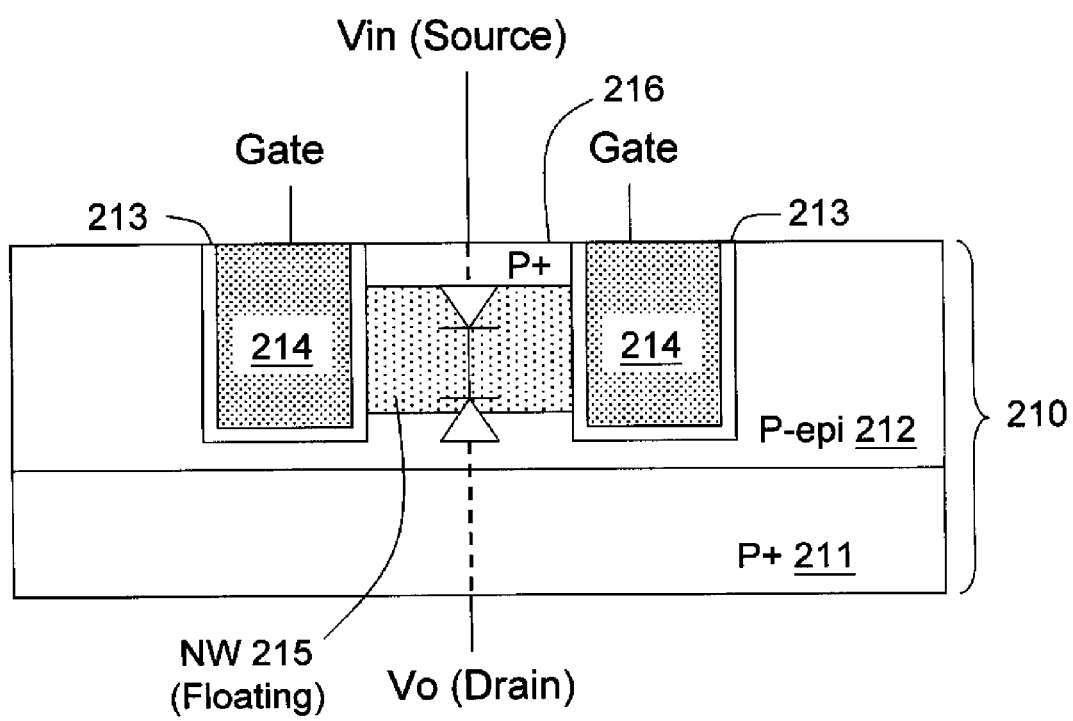
FIG. 12 shows another embodiment of the PMOS transistor in FIG. 9, to illustrate how the present invention may be embodied by a semiconductor structure.

The semiconductor structure of the PMOS transistor 30 is similar to that of the integrated device 20, as referring to the planar type device structure of FIG. 11 and the trench type device structure of FIG. 12. The difference between FIG. 11 and FIG. 3 is that FIG. 11 provides only one P+ doped region 204 as the source of the integrated device 20, and the N type well region 201 is floating. The P+ doped region 204 and the N type well region 201 form the parasitic body diode, i.e., the diode 32D in FIG. 9. The difference between FIG. 12 and FIG. 4 is that FIG. 12 provides only one P+ doped region 216 as the source of the integrated device 20, and the N type well region 215 is floating. The P+ doped region 216 and the N type well region 215 form the parasitic body diode, i.e., the diode 32D in FIG. 9.

Anyone of the above PMOS transistors 30 can be used as the PMOS transistors 30A and 30B in FIG. 10. Certainly, it is also possible for the charging switch circuit 50 of the present invention to employ one integrated device 20 and one PMOS transistor 30. That is, in the charging switch circuit 50 of FIG. 6 or FIG. 7, one of the first and the second integrated devices 20A and 20B is replaced by the PMOS transistor 30. Such arrangement should certainly fall within the scope of the present invention.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. A charging switch circuit for coupling a power source and a battery to be charged, the charging switch circuit comprising:
    a first and a second integrated devices, and a transistor controlling the first integrated device, wherein each integrated device includes:
        a PMOS transistor which includes a gate, a source, a drain and a channel region between the source and the drain, wherein the source, drain and channel region are formed in a substrate, and a parasitic diode is formed between the drain and the channel region; and
        a Schottky diode formed in the substrate and connected in reverse series with the parasitic diode, the Schottky diode having one end connected with the parasitic diode and the other end connected with the source;
    wherein the first integrated device is coupled between the power source and the battery, the source of the first integrated device being coupled to the power source and the drain of the first integrated device being coupled to the battery; the second integrated device is coupled between the gate and the drain of the first integrated device, the source of the second integrated device being coupled to the gate of the first integrated device, the drain of the second integrated device being coupled to the drain of the first integrated device, and the gate of the second integrated device being controlled by the power source; and the transistor controlling the first integrated device has a first end controlled by the power source, a second end receiving a control signal for controlling the first integrated device, and a third end controlling the gate of the first integrated device.

2. The charging switch circuit of claim 1, wherein the transistor controlling the first integrated device is an NMOS transistor, of which the gate is controlled by the power source, the source receives the control signal to control the first integrated device, and the drain controls the gate of the first integrated device.

3. The charging switch circuit of claim 2, wherein the NMOS transistor is a laterally diffused metal oxide semiconductor (LDMOS) transistor.

4. The charging switch circuit of claim 1, wherein the transistor controlling the first integrated device is a bipolar junction transistor (BJT), of which the base is controlled by the power source, the collector receives the control signal to control the first integrated device, and the emitter controls the gate of the first integrated device.

5. The charging switch circuit of claim 4, wherein the BJT is a lateral npn (LNPN) transistor.

6. The charging switch circuit of claim 1, wherein the first and second integrated devices have trench type structures.

7. A charging switch circuit for coupling a power source and a battery to be charged, the charging switch circuit comprising:
    a first PMOS transistor including a gate, a source, a drain and a channel region between the source and the drain, wherein the source, the drain and the channel region are formed in a substrate, a first parasitic diode being formed between the source and the channel region, and a second parasitic diode being formed between the drain and the channel region, wherein the first and the second parasitic diodes are connected in reverse series;
    a second PMOS transistor including a gate, a source, a drain and a channel region between the source and the drain, wherein the source, the drain and the channel region are formed in a substrate, a third parasitic diode being formed between the source and the channel region, and a fourth parasitic diode being formed between the drain and the channel region, wherein the third and the fourth parasitic diodes are connected in reverse series; and
    a transistor controlling the gate of the first PMOS transistor;
    wherein the first PMOS transistor is coupled between the power source and the battery, the source of the first PMOS transistor being coupled to the power source and the drain of the first PMOS transistor being coupled to the battery; the second PMOS transistor is coupled between the gate and the drain of the first PMOS transistor, the source of the second PMOS transistor being coupled to the gate of the first PMOS transistor, the drain of the second PMOS transistor being coupled to the drain of the first PMOS transistor, and the gate of the second PMOS transistor being controlled by the power source; and the transistor controlling the first PMOS transistor has a first end controlled by the power source, a second end receiving a control signal for controlling the first PMOS transistor, and a third end controlling the gate of the first PMOS transistor.

8. The charging switch circuit of claim 7, wherein the transistor controlling the first PMOS transistor is a NMOS transistor, of which the gate is controlled by the power source, the source receives the control signal to control the first PMOS transistor, and the drain controls the gate of the first PMOS transistor.

9. The charging switch circuit of claim 8, wherein the NMOS transistor is a laterally diffused metal oxide semiconductor (LDMOS) transistor.

10. The charging switch circuit of claim 7, wherein the transistor controlling the first PMOS transistor is a bipolar junction transistor (BJT), of which the base is controlled by the power source, the collector receives the control signal to control the first PMOS transistor, and the emitter controls the gate of the first PMOS transistor.

11. The charging switch circuit of claim 10, wherein the BJT is a lateral npn (LNPN) transistor.

12. The charging switch circuit of claim 7, wherein the first and second PMOS transistors have trench type structures.

13. The charging switch circuit of claim 7, wherein one of the first and third parasitic diodes is a Schottky diode.

* * * * *